(12) United States Patent
Padullaparthi

(10) Patent No.: US 9,438,010 B1
(45) Date of Patent: Sep. 6, 2016

(54) VERTICAL CAVITY SURFACE EMMITING LASER

(71) Applicant: SAE Magnetics (H.K.) Ltd., Hong Kong (CN)

(72) Inventor: Babu Dayal Padullaparthi, Hong Kong (CN)

(73) Assignee: SAE Magnetics (H.K.) Ltd., Hong Kong (CN)

( * ) Notice: Subject to any disclaimer, the term of this patent is extended or adjusted under 35 U.S.C. 154(b) by 0 days.

(21) Appl. No.: 14/678,414

(22) Filed: Apr. 3, 2015

(30) Foreign Application Priority Data

Mar. 20, 2015 (CN) .......................... 2015 1 0124564

(51) Int. Cl.
*H01S 5/00* (2006.01)
*H01S 5/187* (2006.01)
*H01S 5/343* (2006.01)
*H01S 5/34* (2006.01)
*H01S 5/183* (2006.01)

(52) U.S. Cl.
CPC ........... *H01S 5/187* (2013.01); *H01S 5/18361* (2013.01); *H01S 5/3407* (2013.01); *H01S 5/3434* (2013.01); *H01S 5/34313* (2013.01)

(58) Field of Classification Search
CPC .. H01S 5/4093; H01S 5/0202; H01S 5/0203; H01S 5/0268; H01S 5/0425; H01S 5/10; H01S 5/183; H01S 5/18377; H01S 5/2009; H01S 5/22; H01S 5/34333; H01S 5/4031
USPC ..................................................... 372/45.012
See application file for complete search history.

(56) References Cited

U.S. PATENT DOCUMENTS

| | | | |
|---|---|---|---|
| 6,711,195 B2 | 3/2004 | Chang et al. | |
| 7,065,117 B2 * | 6/2006 | Yamanaka | H01S 5/028 372/43.01 |
| 7,829,912 B2 | 11/2010 | Johnson | |
| 8,837,547 B2 | 9/2014 | Johnson et al. | |
| 2012/0236891 A1 * | 9/2012 | Johnson | B82Y 20/00 372/45.01 |
| 2014/0198817 A1 | 7/2014 | Johnson et al. | |

* cited by examiner

*Primary Examiner* — Tod T Van Roy
*Assistant Examiner* — Vu A Vu
(74) *Attorney, Agent, or Firm* — Nixon & Vanderhye PC

(57) ABSTRACT

A VCSEL according to the invention, configured to emit a light having about 850 nm wavelength, comprises an active region which comprises one or more $In_xGa_{1-x}As$ quantum wells; two or more $GaAs_{1-y}P_y$ barriers bonding to the one or more quantum wells; and x ranges from 0.05 to 0.1, and y ranges from 0.2 to 0.29. The VCSEL has increased optical confinement and high transmission speed, good reliability characteristics, high-temperature performance, and long life time.

15 Claims, 4 Drawing Sheets

VERTICAL CAVITY SURFACE EMMITING LASER

This application claims priority to Chinese Application No. 201510124564.0 filed Mar. 20, 2015, the entire contents of which is hereby incorporated by reference.

FIELD OF THE INVENTION

The present invention relates to a vertical cavity surface emitting laser (VCSEL), and more particularly to a VCSEL emitting a light having a wavelength of 850 nm with quantum wells and barriers with improved reliability.

BACKGROUND OF THE INVENTION

A VCSEL is a semiconductor laser that emits light in a vertical direction with respect to a substrate. In general VCSEL has an active region with a large gain, a low threshold current, high optical power, reliability, and adequately controlled polarization. Since the VCSEL does not require a cleavage process, it allows to be integrated into two-dimensional arrays for on-wafer testing. It is suitably used in various consumer applications such as the light source of an image forming apparatus, the light source of an optical pickup device, the optical communication data transmitter of optical interconnections and optical modules, etc.

The active region of the VCSEL arranged between two semiconductor multilayer reflector (DBR: Distributed Bragg Reflector, for example) mirrors is the region in which electrons and holes combine to generate light. The active region includes a quantum-well structure provides the photonic device with a lower threshold current, a high efficiency and a greater flexibility in choice of emission wavelength.

A quantum-well structure is composed of at least one (n) quantum-well layer interleaved with a corresponding number (n+1) of barrier layers. Each of the quantum well layers has a thickness in the range from about one nanometer to about ten nanometers. The barrier layers are typically thicker than the quantum well layers. The semiconductor materials of the layers of the quantum-well structure depend on the desired emission wavelength of the photonic device. The semiconductor material of the barrier layers differs from that of the quantum-well layer, and has larger bandgap energy and a lower refractive index than that of the quantum well layer.

A quantum-well structure composed of gallium arsenide (GaAs) quantum well layers and aluminum gallium arsenide (AlGaAs) barrier layers has been proposed for the active region of a conventional VCSEL to generate light with a wavelength of 850 nm. FIG. 1a is an energy-band diagram of an exemplary active region 10 incorporating such a quantum-well structure. Band energy is plotted as ordinate and distance from the substrate is plotted as abscissa. As shown, the active region 10 includes a first cladding layer 121, a first barrier layer 141 made of AlGaAs, a quantum-well layer 16 made of GaAs, a second barrier layer 142 made of AlGaAs, and the second cladding layer 121. The energy-band diagram of FIG. 1a shows the energies of the conduction band 101 and valence band 102 of the semiconductor material of each of the layers just described.

The active region 10 composed of the barrier layers 141 and 142 of AlGaAs and the quantum-well layer 16 of GaAs has a Type I heterostructure. In this heterostructure, the energy of the valence band of GaAs of the quantum-well layer 16 is greater than the energy of the valence band of the AlGaAs of the barrier layers 141 and 142, but the energy of the conduction band of GaAs of the quantum-well layer 16 is less than the energy of the valence band of the AlGaAs of the barrier layers 141 and 142.

The line-up of the band energies in a quantum-well structure having a Type I heterostructure confines electrons 156 to the conduction band 101 of the quantum-well structure 16 and confines holes 158 to the valence band 102 of the quantum-well structure 16. As a result, the electron-hole recombination process takes place between carriers confined in the same layer.

However, the conduction band and valence band discontinuities (ΔEc and ΔEv) between GaAs quantum well and AlGaAs barrier layers are small due to their fixed bandgap values, thus carrier leakage will happen in the quantum well layers 16 from the quantum well layer across the barrier layers as shown in FIG. 1b which brings a reduced performance, such as the optical confinement in the region layer is low, the high temperature performance is reduced, and the reliability characteristics of the VCSELs causes a degraded life time due to internal self heating effect. Besides above, in the moisture/humidity ambient the element Al in the barrier layer can easily be oxidized and can form defects or dislocations causing further reduction of the life time of VCSELs.

U.S. Pat. No. 8,837,547 B2, US Publication No. 2014/0198817 A1, and US Publication No. 2012/0236891 disclose 850 nm wavelength VCSEL respectively, but all of them has the drawbacks mentioned above more or less.

Thus, it is desired to provide an improved VCSEL structure with increased optical confinement and increased speed, good high temperature and reliability characteristics and long life time to overcome the above-mentioned drawbacks.

SUMMARY OF THE INVENTION

One objective of the present invention is to provide vertical cavity surface emitting laser (VCSEL) which has increased optical confinement and high transmission speed, good reliability characteristics, high-temperature performance, and long life time.

To achieve above objective, a VCSEL according to the invention, configured to emit a light having about 850 nm wavelength, comprises an active region which comprises one or more compressively strained $In_xGa_{1-x}As$ quantum wells; two or more tensile strained $GaAs_{1-y}P_y$ barriers bonding to the one or more quantum wells; and x ranges from 0.05 to 0.1, and y ranges from 0.2 to 0.29.

As an embodiment, the active region further comprises one or more separate confinement heterostructure layers formed adjacent to the barriers, and the separate confinement heterostructure layers are made of AlGaAs.

Preferably, the separate confinement heterostructure layer is formed as a continuous ramp.

Preferably, the quantum wells and the barriers have a thickness ranging from 3 to 5 nm.

As another embodiment, the conduction band and valence band discontinuities (ΔEc and ΔEv) of disclosed 850 nm VCSEL structure have at least few meV larger than the conventional 850 nm VCSEL with GaAs Quantum wells and AlGaAs barriers.

Preferably, a bandgap discontinuities ΔEc and ΔEv between two energy bands is in a range of 5~50 meV and 5~20 meV respectively larger than ΔEc and ΔEv of GaAs Quantum wells and AlGaAs barriers.

Preferably, the quantum wells and the barriers are grown on a substrate of un-doped GaAs or p-/n-doped with silicon.

Preferably, the VCESEL further includes a mesa structure and a passivation layer made by a low dielectric constant oxide material such as $SiO_xN$ or polymer (polyimide or BCB) or both covered on an outer surface of the mesa structure.

Preferably, further comprises two reflecting mirror stacks sandwiching the active region, more preferably the reflecting mirror stacks are distributed Bragg reflectors (DBRs).

Preferably, at least one of the reflecting mirror stacks includes a high Al (>98%) containing III-V semiconductor thin layer in the form as annular oxide layer providing a current confinement structure.

In comparison with the prior art, as the active region of the present invention applies the strained quantum wells of $In_xGa_{1-x}As$, and the strained barriers of $GaAs_{1-y}P_y$, instead of the conventional barrier of GaAs, the barriers of $GaAs_{1-y}P_y$ according to the present invention provide a higher band gap to prevent carriers leakage or overflow, so as to bring improved optical confinement and improved communication speed. Further the barrier of $GaAs_{1-y}P_y$ is good for resisting high temperature, and obtains a long life time for the semiconductor device.

Other aspects, features, and advantages of this invention will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings:

FIG. 1b shows carrier leakage in the conventional active region of FIG. 1a;

DETAILED DESCRIPTION OF ILLUSTRATED EMBODIMENTS

Figure 1A:
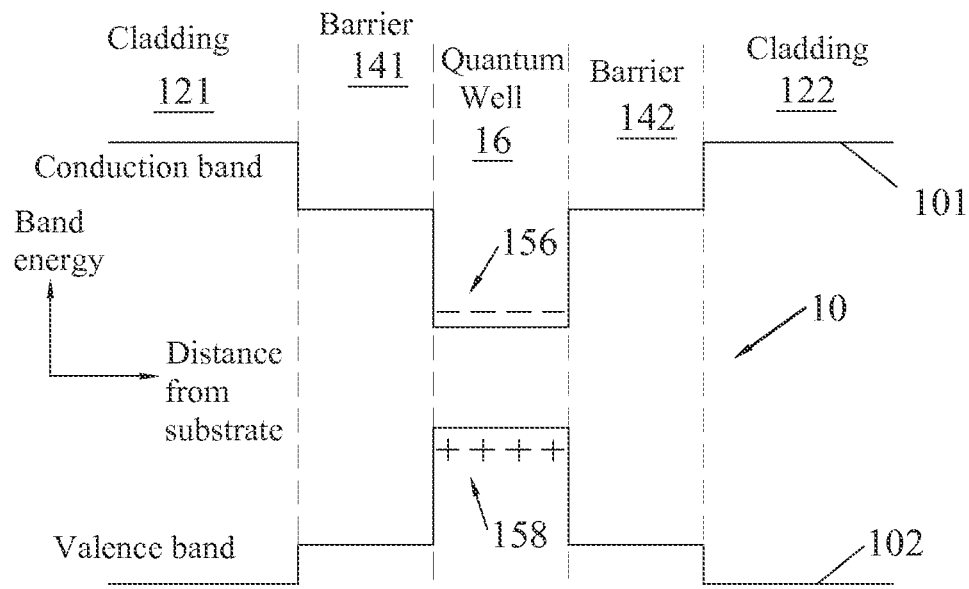
FIG. 1a is an energy-band diagram of an active region of a conventional VCSEL.
Figure 1B:
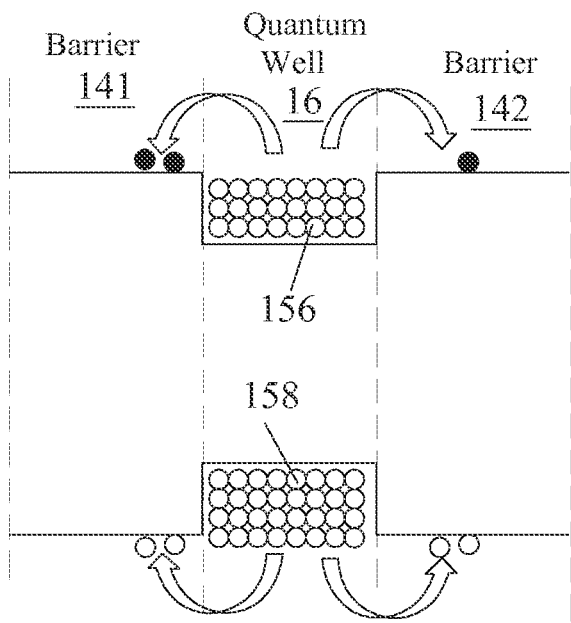

Various preferred embodiments of the invention will now be described with reference to the figures, wherein like reference numerals designate similar parts throughout the various views. As indicated above, the invention is directed to a VCSEL which has increased optical confinement and high transmission speed, good reliability characteristics, high-temperature performance, and long life time.

It should be noted that, the VCSEL of the present invention is directed to emit light with about 850 nm wavelength, with photoluminescence emission at 840 nm and full VCSEL Fabry-Perot (FP) dip at 846 nm.

Figure 2:
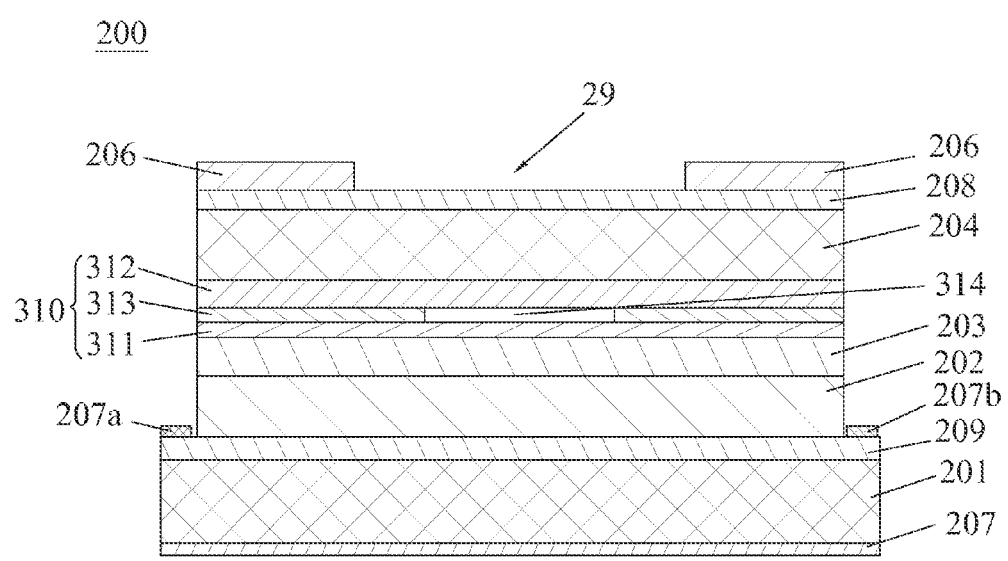
FIG. 2 is cross section of a VCSEL according to an embodiment of the present invention.

FIG. 2 is a cross-sectional view of a VCSEL device according to a first embodiment of the present invention. The VCSEL device 200 includes a substrate 201, a bottom DBR 202 and a top DBR 204 formed on the substrate 201, an active region 203 sandwiched between the bottom DBR 202 and top DBR 204 to generate laser light. A top electrode layer 206 is formed on and electrically connected with the top DBR 204, and a bottom electrode layer 207 is formed beneath the substrate 201, which are adapted for applying current to the active region 203 to generate laser light. A first window 29 is opened in the top electrode layer 206, so as to expose a part of the top DBR 204.

The substrate 201 may be n-type GaAs doped with silicon, p-type GaAs doped with silicon, or an undoped/semi-insulating GaAs. In the present embodiment, the substrate 201 is an un-doped (semi-insulating) GaAs. In this case the bottom electrode layer 207 (207a, 207b) is made to present on the top side. The bottom electrode layer 207 forms an Ohmic contact to the substrate 201 and is typically made of electrically conductive metal. In this case, bottom electrode layer 207 can also be made present at the bottom of the substrate 201 as shown in FIG. 2.

Concretely, the bottom DBR 202 can be n-type reflector or p-type reflector, and the top DBR 204 has the opposite polarity. In the present embodiment, the bottom DBR 202 is an n-type reflector and the top DBR 204 is a p-type reflector. Generally, the bottom and top DBRs 202, and 204 respectively are stacks of III-V group semiconductor layers in different refractive index layers alternately arranged, which are made with materials such as AlAs, GaAs, or AlGaAs having different mole fractions of Aluminum and Gallium. In actual implementations, each of DBR 202 or 204 may includes many layers such as twenty or thirty pairs of layers, or more. Preferably, for the emission wavelength around 850 nm, the bottom DBR 202 is optimized to include stacks of $Al_{0.12}Ga_{0.88}As$ and $Al_{0.9}Ga_{0.1}As$, and $Al_{0.12}Ga_{0.88}As$ and AlAs.

The active region 203 is typically constructed from one or more quantum wells and multiple barriers. The active region 203 is configured to generate light having a predetermined emission wavelength. The predetermined emission wavelengths of 850 nm is used for high-speed data-communication in the VCSEL device 200 of the present invention with the predetermined material described thereinafter, other emission wavelengths will not be applicable with the present invention.

When a drive current is applied to the top and bottom electrode layers 206, 207, it flows through the active region 203, and then laser light is generated in the active region 203. The laser light is amplified while it is reflected at each interface between layers of top DBR 204 and bottom DBR 202, and is emitted from the first window 29 of the VCSEL device 200 vertically.

Referring to FIG. 2, the VCSEL 200 further includes a heavily p-doped contact layer 208 formed between the top electrode layer 206 and the top DBR 204. The contact layer 208 is made of GaAs, AlGaAS or InGaAs.

As an improved embodiment, an oxide section 310 is formed on the active region 203, and the oxide section 310 includes at least two phase matching layers (PML) 311, 312 (in the figures only two phase matching layers are shown) and a current limiting/confining layer 313 sandwiched between the two PML layers 311, 312. The current limiting/confinement layer 313 is made of high Al molefraction (>98%), for example $Al_{0.98}Ga_{0.02}As$ or AlAs semiconductor layers subjected to wet thermal oxidation process to create Al containing oxide and is used to direct the electrical current generally toward the center of the active region 203 through oxide aperture region 314. When used, the current limiting layer 313 insulates all but a circular or polygon-shaped window 314 having a diameter being of the order of the diameter of the first window 29. Because most of the electrical current is directed toward the center of the active region 203, most of the light is generated within the center portion of the active region 203. And the phase matching layers 311, 312 are made of AlGaAs semiconductor with different mole fractions of Al and Ga. For efficient high speed operation, a VCSEL structure can include at least one individual oxide section with at least one current limiting/confining layers because, the addition of additional current limiting/confining layers decreases mesa capacitance and hence increases the bandwidth and speed of VCSEL device.

In a mesa structure (not shown in the figure) of the VCSEL 200, an insulator (not shown) acted as a passivation layer which is made of silicon oxynitride ($SiO_xN$) a thickness of 1.0 µm for example is formed to cover the outer side surface of the mesa structure, namely cover the exposed side layers of the elements mentioned above. In addition to the above passivation layer ($SiO_xN$), a 5~10 µm thick polyimide or BCB coating is simultaneously applied to further reduce p- and n-electrode pad capacitances. The insulator is used for protecting the whole layers of the VCSEL 200.

Figure 3:
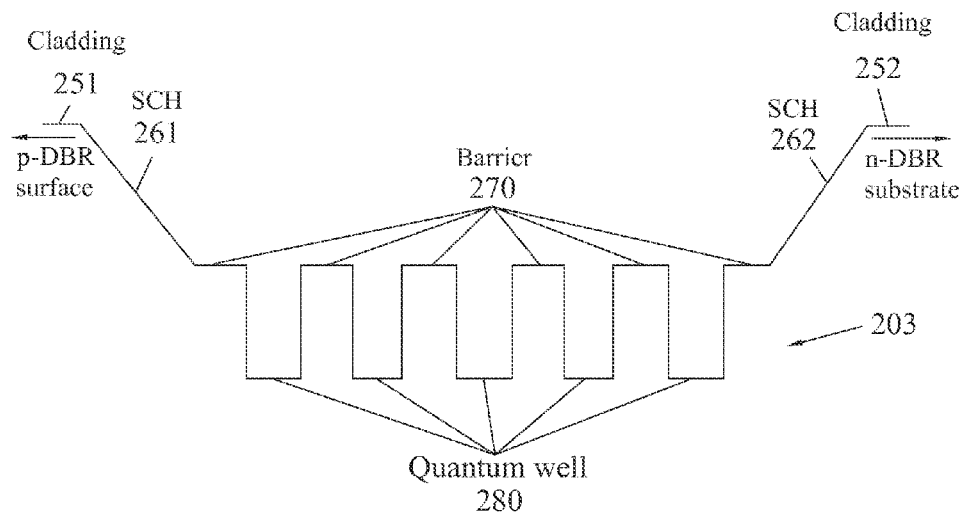
FIG. 3 is a simplified profile of the active region according to the present invention.

With the contemplation of the present invention, the active region 203 of the VCSEL 200 has one or more quantum wells 280 and two or more barriers 270, as shown in FIG. 3. The quantum wells 280 and barriers 270 are physically adjacent and connected to each other. Electrical confining regions can sandwich the active region 203 and provide optical gain efficiency by confining carriers to the active region 203. Preferably, the quantum wells 280 is made of $In_xGa_{1-x}As$ and the barriers 270 is made of $GaAs_{1-y}P_y$, and the value of x in $In_xGa_{1-x}As$ ranges from 0.05 to 0.1, and the value of y in $GaAs_{1-y}P_y$ ranges from 0.2 to 0.29. In the present invention disclosure, a total of five $In_xGa_{1-x}As$ quantum wells layers with value of x=0.06 and a total of six $GaAs_{1-y}P_y$ barrier layers with value of y=0.75 including four inner barriers and two outer barriers. All the five $In_xGa_{1-x}As$ quantum wells layers and the four inner $GaAs_{1-y}P_y$ barrier layers have a thickness of 4.0 nm and 2 outer $GaAs_{1-y}P_y$ barrier layers have a thickness of 10.0 nm for a emission wavelength targeted at 840 nm wavelength.

It is one of the objectives of this invention to make strain compensated optical cavity with Al-free active region for high-speed data-communication VCSELs with high device performance described previously. It is to be noted that a strain compensated data-communication VCSEL at 1060 nm wavelength with five $In_{0.29}Ga_{0.71}As$ compressively strained quantum wells and six $GaAs_{0.75}P_{0.25}$ tensile strained barrier layers with thickness different from current invention was reported. The net strain resulting from compressively strained quantum wells and tensile strained barrier layers would be carefully optimized to a nearly zero strain value. But till now, there was no data-communication VCSEL design with $In_xGa_{1-x}As$ compressively strained quantum wells and $GaAs_{1-y}P_y$ tensile strained barrier layers targeted at 850 nm emission wavelength band with net strain to zero value. Therefore in the current invention for a fine tuned/optimized 850 nm data-communication VCSEL, preferably the quantum wells and the barriers have a thicknesses from 3 nm to 5 nm.

It is also one of the objectives of this invention to have same $In_xGa_{1-x}As$ compressively strained quantum wells and $GaAs_{1-y}P_y$ tensile strained barrier layers double heterostructure system at both 1060 nm and 850 nm wavelength bands. At 1060 nm wavelength, standards OM2 (optical multimode fiber standards), OM3, OM4 optical fibers can't be directly used and a dispersion compensated fiber is needed and this is costlier than standard OM2, OM3, OM4 fibers. However at 850 nm band, standard OM2, OM3, OM4 fibers can readily be used for data transmission without having dispersion compensated fibers. This factor alone has large commercial benefits by using a high performance and high speed VCSEL at 850 nm wavelength.

Figure 4:
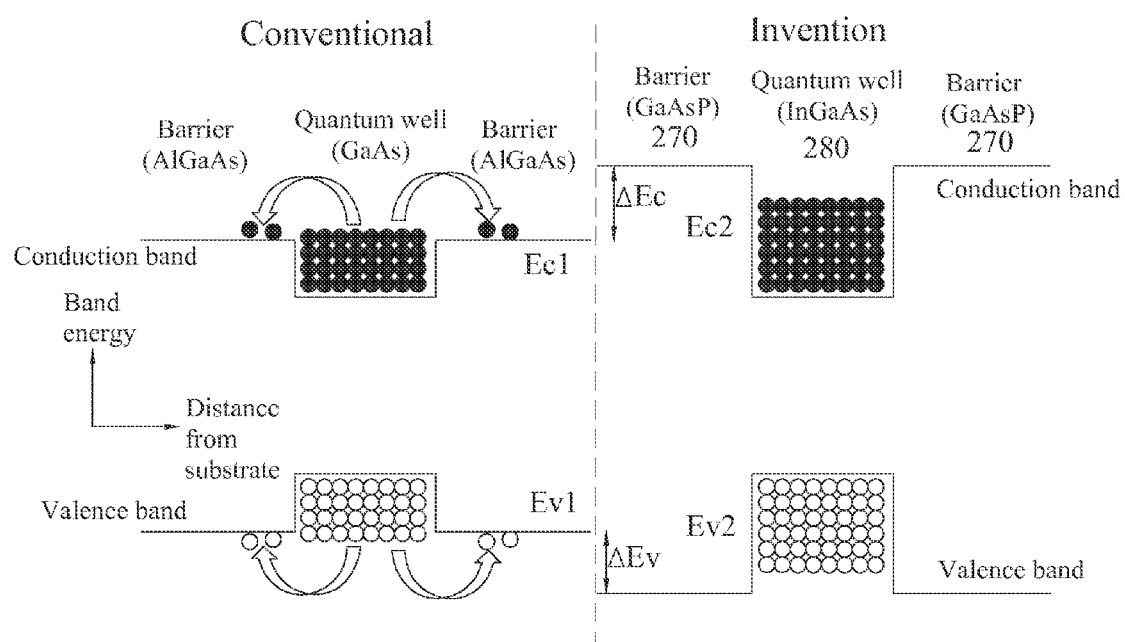
FIG. 4 is an energy-band comparison diagram between the VCSEL according to the present invention and the conventional VCSEL.

As shown in FIG. 4, it shows a comparison diagram showing an energy band of the active region 203 of the present invention and the conventional 850 nm VCSEL with GaAs quantum wells and AlGaAs barriers. As shown, in the conduction band, the barriers of AlGaAs of the conventional 850 nm VCSEL provides an energy level Ec1, the barriers 270 of $GaAs_{1-y}P_y$ of the invention provides an energy level Ec2 which is larger than Ec1, and the difference value ΔEc is in a range of 5~50 meV or higher; in the valence band, the barriers of AlGaAs of the conventional 850 nm VCSEL provides an energy level Ev1, the barriers 270 of $GaAs_{1-y}P_y$ of the invention provides an energy level Ev2 which is larger than Ev1, and the difference value ΔEv is in a range of 5~20 meV or higher.

As shown in FIG. 3 again, the active region 203 further includes one or more separate confinement heterostructure (SCH) layers 261, 262 connected to the barriers 270 respectively, and two cladding layers 251, 252 sandwiching the quantum wells 280, the barriers 270, and the SCH layers 261, 262. Specifically, the SCH layers 261, 262 are made of AlGaAs, and the cladding layers 251, 252 are un-doped with respect to p-DBR and n-DBRs. In this embodiment, the SCH layers 261, 262 are formed as a continuous ramp, and no other material or a transition layer exists along the ramp of graded SCH as disclosed by U.S. Pat. No. 8,837,547 B2.

Figure 5A:
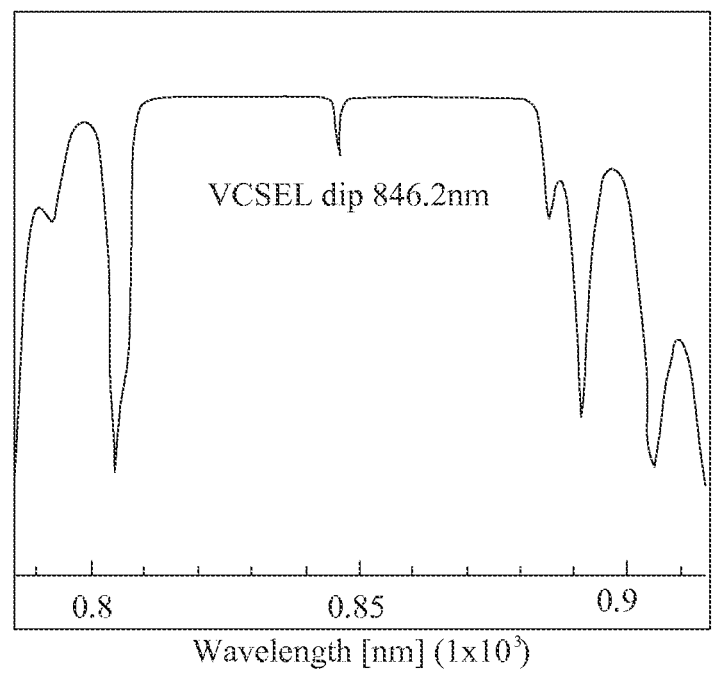
FIG. 5a shows an the calculated full VCSEL F-P dip wavelength according to the present invention.
Figure 5B:
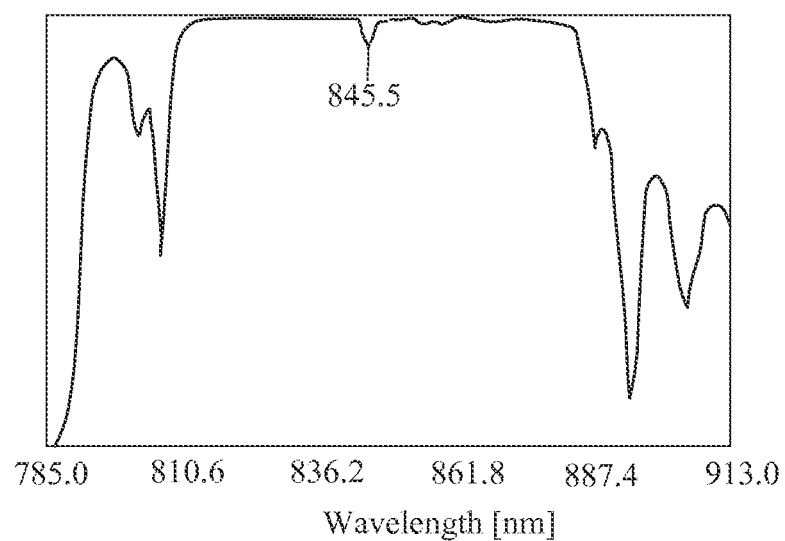
FIG. 5b shows an experimental epitaxially/MOCVD grown full VCSEL F-P dip wavelength.

FIG. 5a shows the calculated result for light emission wavelength of the full VCSEL 200 according to the present invention. As shown, the wavelength of the light in the VCSEL F-P dip is 846.2 nm. The result is very close to the epi-taxially grown full VCSEL F-P dip value at 845.5 nm as show in FIG. 5b. This confirms that, the current disclosed VCSEL 200 with the active region 203 of the present invention is applicable to emit light of about 850 nm wavelength.

In conclusion, as the active region 203 of the present invention applies the compressively strained quantum wells 280 of $In_xGa_{1-x}As$, and the tensile strained barriers 270 of $GaAs_{1-y}P_y$, instead of the conventional un-strained barrier of GaAs, the barriers 270 of $GaAs_{1-y}P_y$ according to the present invention provide a higher band gap to prevent carriers leakage or overflow, so as to bring improved optical confinement and improved communication speed. Further the barrier of $GaAs_{1-y}P_y$ is good for high temperature performance, and provides a longer life time for the semiconductor laser device.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A vertical cavity surface emitting laser (VCSEL), configured to emit a light having about 850 nm wavelength, comprising:
   an active region which comprises:
      one or more $In_xGa_{1-x}As$ quantum wells; and
      two or more $GaAs_{1-y}P_y$ barriers bonding to the one or more quantum wells;
   first and second phase matching layers; and
   two reflecting mirror stacks sandwiching the active region;

wherein x ranges from 0.05 to 0.1, and y ranges from 0.2 to 0.29; and wherein at least one of the reflecting mirror stacks includes an annular or polygonal oxide layer providing a current confinement structure sandwiched between the first and second phase matching layers.

2. The VCSEL according to claim 1, wherein the active region further comprises one or more separate confinement heterostructure layers formed adjacent to the barriers, and the separate confinement heterostructure layers are made of AlGaAs.

3. The VCSEL according to claim 2, wherein the separate confinement heterostructure layer is formed as a continuous ramp.

4. The VCSEL according to claim 1, wherein the quantum well(s) and the barriers have a thickness ranging from 3 nm to 5 nm.

5. The VCSEL according to claim 1, wherein the quantum well(s) and the barriers are grown on a substrate of un-doped GaAs or p-/n-doped with silicon.

6. The VCSEL according to claim 1, further comprising a mesa structure and a passivation layer made by a low dielectric constant oxide or polymer or both covered on an outer surface of the mesa structure.

7. The VCSEL according to claim 1, wherein at least one of the reflecting mirror stacks includes an annular oxide layer providing the current confinement structure.

8. The VCSEL according to claim 1, wherein the at least one reflecting mirror stack that includes the annular or polygonal oxide layer is made by wet thermal oxidation, and the current confinement structure is in an oxide window.

9. The VCSEL according to claim 1, wherein the barriers are tensile-strained and the one or more quantum wells is/are compressively strained so that the net strain is nearly zero and act as a strain compensated double structure (DHS) system.

10. A vertical cavity surface emitting laser (VCSEL), comprising:
an active region which comprises:
one or more $In_xGa_{1-x}As$ quantum wells; and
two or more $GaAs_{1-y}P_y$ barriers bonding to the one or more quantum wells;
first and second phase matching layers; and
two reflecting mirror stacks sandwiching the active region;
wherein there is a lack of transitional layers between the one or more quantum wells and the barriers;
wherein at least one of the reflecting mirror stacks includes an annular or polygonal oxide layer providing a current confinement structure sandwiched between the first and second phase matching layers;
wherein x ranges from 0.05 to 0.1, and y ranges from 0.2 to 0.29; and
wherein the VCSEL is configured to emit a light having about 850 nm wavelength.

11. The VCSEL according to claim 10, wherein the active region further comprises one or more separate confinement heterostructure layers formed adjacent to the barriers, and the separate confinement heterostructure layers are made of AlGaAs.

12. The VCSEL according to claim 11, wherein the separate confinement heterostructure layer is formed as a continuous ramp.

13. The VCSEL according to claim 10, wherein the at least one reflecting mirror stack that includes the annular or polygonal oxide layer is made by wet thermal oxidation, and the current confinement structure is in an oxide window.

14. The VCSEL according to claim 10, wherein the barriers are tensile-strained and the one or more quantum wells is/are compressively strained so that the net strain is nearly zero and act as a strain compensated double structure (DHS) system.

15. A vertical cavity surface emitting laser (VCSEL) for an optical module used in data communications, comprising:
an active region which comprises:
one or more $In_xGa_{1-x}As$ quantum wells; and
two or more $GaAs_{1-y}P_y$ barriers bonding to the one or more quantum wells, the barriers being tensile-strained;
first and second phase matching layers; and
two reflecting mirror stacks sandwiching the active region;
wherein at least one of the reflecting mirror stacks includes an annular or polygonal oxide layer providing a current confinement structure sandwiched between the first and second phase matching layers;
wherein the active region further comprises one or more separate confinement heterostructure layers formed adjacent to the barriers, the separate confinement heterostructure layer(s) being made of AlGaAs and being formed as a continuous ramp with no other transitional layers existing there-along;
wherein x ranges from 0.05 to 0.1, and y ranges from 0.2 to 0.29; and
wherein the VCSEL is configured to emit a light having about 850 nm wavelength.

* * * * *